United States Patent
Manneschi

(10) Patent No.: US 12,253,643 B2
(45) Date of Patent: Mar. 18, 2025

(54) PORTABLE DETECTION SYSTEM COMPRISING MAGNETOSTATIC SENSORS

(71) Applicant: Alessandro Manneschi, Arezzo (IT)

(72) Inventor: Alessandro Manneschi, Arezzo (IT)

( * ) Notice: Subject to any disclaimer, the term of this patent is extended or adjusted under 35 U.S.C. 154(b) by 630 days.

(21) Appl. No.: 17/255,055

(22) PCT Filed: Jun. 28, 2019

(86) PCT No.: PCT/EP2019/067474
§ 371 (c)(1),
(2) Date: Dec. 22, 2020

(87) PCT Pub. No.: WO2020/002679
PCT Pub. Date: Jan. 2, 2020

(65) Prior Publication Data
US 2021/0263178 A1    Aug. 26, 2021

(30) Foreign Application Priority Data

Jun. 28, 2018 (FR) ...................................... 1855900

(51) Int. Cl.
*G01V 3/08* (2006.01)
*G08B 21/18* (2006.01)

(52) U.S. Cl.
CPC .......... *G01V 3/081* (2013.01); *G08B 21/182* (2013.01)

(58) Field of Classification Search
CPC ............ G01R 33/0017; G01R 33/0023; G01R 33/0094; G01R 33/02; G01V 3/081; G01V 3/104; G01V 3/165; G06B 21/182

(Continued)

(56) References Cited

U.S. PATENT DOCUMENTS

| | | | |
|---|---|---|---|
| 7,408,461 B1 * | 8/2008 | Fluck | G01V 3/081 324/244 |
| 2006/0197523 A1 | 9/2006 | Palecki et al. | |

(Continued)

FOREIGN PATENT DOCUMENTS

| | | |
|---|---|---|
| EP | 1247119 B1 | 5/2013 |
| JP | 2013205342 A | 10/2013 |
| WO | 2011020148 A1 | 2/2011 |

OTHER PUBLICATIONS

French Search Report for Application No. 1855900 dated Jun. 7, 2019, 2 pages.

(Continued)

*Primary Examiner* — Eman A Alkafawi
*Assistant Examiner* — Rahul Maini
(74) *Attorney, Agent, or Firm* — Lerner David LLP

(57) ABSTRACT

A system for detecting a target object including: a first and a second detector which have magnetic sensors configured to detect a magnetic field and to generate a signal which indicates a magnetic field intensity; a processing unit configured to receive the signals which indicate an intensity of a magnetic field detected by the sensors; and a communication interface which is configured to transmit the signals generated by the magnetic sensors to the processing unit, the processing unit additionally being configured to determine a corrected value of the signals generated by the magnetic sensors of the first and second detectors and, when the corrected value is greater than a predetermined threshold value, to send instructions for generating an alarm.

22 Claims, 8 Drawing Sheets

(58) Field of Classification Search
USPC .............. 324/244, 245, 257, 258, 260, 262
See application file for complete search history.

(56) References Cited

U.S. PATENT DOCUMENTS

| | | |
|---|---|---|
| 2015/0287260 A1 | 10/2015 | Toyoda et al. |
| 2017/0176623 A1 | 6/2017 | Appleby et al. |
| 2018/0012465 A1 | 1/2018 | Keene et al. |
| 2021/0302508 A1* | 9/2021 | Keene .................... G01V 3/081 |

OTHER PUBLICATIONS

International Search Report for Application No. PCT/EP2019/067474 dated Oct. 4, 2019, 3 pages.

\* cited by examiner

PORTABLE DETECTION SYSTEM COMPRISING MAGNETOSTATIC SENSORS

CROSS-REFERENCE TO RELATED APPLICATIONS

The present application is a national phase entry under 35 U.S.C. § 371 of International Application No. PCT/EP2019/067474 filed Jun. 28, 2019, which claims priority from French Application No. 1855900 filed Jun. 28, 2018, all of which are incorporated herein by reference.

FIELD OF THE INVENTION

The invention relates to the field of the detection of target objects, and specifically the detection of objects containing magnetized or ferromagnetic components.

TECHNICAL BACKGROUND

The current climate resulting from various attacks in public places has given rise to a need to detect weapons of assault rifle type at the entrances of public places, such as stadiums, concert halls, department stores etc.

Currently, this detection is generally provided by security personnel, equipped with manual portable detectors moved along the body and around the possessions of people wishing to enter the various public places in question. However, such an inspection is lengthy and burdensome, and the quantity of people wishing to enter the place in question is often too great for it to be carried out in a satisfactory manner.

It has also been proposed to install permanent gates at the entrances of the various public places. These gates are suitable in cases where a fixed installation is necessary. However, such an installation requires considerable work to be carried out, which makes it unsuitable for public places of stadium, concert hall and department store type. However, in public places, it is necessary to be able to free up space to allow for a possible emergency exit without hindrance, which makes the use of portable systems desirable.

It has also been proposed to use portable individual barriers comprising magnetostatic sensors. Such barriers generally comprise a post attached to a base and equipped with at least one magnetostatic sensor, for example three magnetostatic sensors distributed over the height of the post. Each sensor is configured to generate a (voltage) signal representative of an intensity of a detected electromagnetic field. These barriers are in particular used in prisons in order to detect if the prisoners are carrying magnetic objects, and mobile phones in particular. To do so, the sensitivity of the magnetic sensors can be very high, since prisoners are normally not allowed any metal or magnetic materials.

To increase the sensitivity of these barriers, it has also been proposed to use them in pairs so as to form a gate. Specifically, the sensitivity of the sensors decreases exponentially with distance. Such barriers have the advantage of being portable and not requiring any work to install them. In addition, as current assault rifles are made of a ferromagnetic material and are large in size, the disruption that they generate in the Earth's electromagnetic field is significant enough to be detected by these sensors.

However, unlike prisons, people often wear or carry metal objects that can include magnetized or ferromagnetic parts and in most cases smartphones, the chips of which are magnetized. However, the autonomous magnetic field of smartphones is substantially comparable to the disruption in the Earth's electromagnetic field generated by the passing of an assault rifle. The passing of these people therefore systematically triggers the barrier alarm, even in the absence of assault rifles. It is therefore necessary to be able to distinguish between smartphones and assault rifles in order to guarantee the ability of the barriers to detect these weapons.

It has therefore been proposed in document WO 2017/141022 to add a spacer to each of the barriers, in order to guide the inspected person and make him or her pass through the middle of the gate formed by the barriers, where the sensitivity of the gate formed by a pair of barriers is more uniform. Specifically, the sensitivity of the magnetostatic sensors being inversely proportional to the distance, the sensors are more sensitive near the barriers than in the center. However, this excess of sensitivity near the barriers causes an almost total rate of spurious alarms. The presence of the spacers therefore makes it possible to avoid the people being inspected coming too close to the barriers and ensure that they remain in the center of the gate, where the sensitivity is lower and would be more uniform.

However, such an increase in the distance between the barriers risks making the gate sensitive to environmental interference insofar as the signal at this distance from the barriers is lower and therefore more similar to the signals generated by the surrounding elements. In addition, the barriers thus obtained are more difficult to transport, as they are a good deal heavier and bulkier than the initial barriers. Finally, in cases where multiple gates have to be created, particularly at approaches to stadiums or large concert halls, the assembly formed by each pair of barriers is very bulky and thus limits the number of gates that can be created.

SUMMARY OF THE INVENTION

An aim of the invention is therefore to propose a detection system that can be installed and uninstalled quickly, for example at the entrances of public places, that is capable of reliably distinguishing between small objects comprising magnetic components, such as smartphones, and detecting assault rifles while being of reasonable bulk.

To do this, the invention proposes a system for detecting a target object comprising:
- a first detector comprising at least one first magnetic sensor configured to generate a signal representative of an intensity of a detected magnetic field,
- a second detector separate from the first detector and comprising at least a second magnetic sensor configured to generate a signal representative of an intensity of a detected magnetic field, and
- a processing unit configured to receive the signals representative of an intensity of a magnetic field detected by the first magnetic sensor and/or the second magnetic sensor.

The detection system further comprises at least one communication interface configured to transmit the signal generated by the first and/or the second magnetic sensor to the processing unit. Moreover, the processing unit is configured to determine a corrected value of the signals generated by the magnetic sensors of the first and second detectors by applying an attenuation coefficient to the signals generated by the magnetic sensor or sensors and, when said corrected value is greater than a predetermined threshold value, sending instructions to generate an alarm.

Certain preferred but non-limiting aspects of the detection system described above are as follows, taken individually or in combination:

the communication interface is a wireless communication interface.

the first and the second detector are portable.

the system further comprises a third detector, the third detector comprising at least one third magnetic sensor configured to detect a magnetic field and generate a signal representative of an intensity of the magnetic field thus detected, and the first detector and the second detector forming a first gate and the second detector and the third detector together forming a second gate.

a processing unit is housed in each of the first and second detectors and the processing unit housed in the second detector is configured, on the one hand, to compute a corrected value of the signals generated by the magnetic sensors of the second and third detectors by applying an attenuation coefficient to the signals generated by the second and third magnetic sensors and, on the other hand, to transmit to the processing unit of the first detector via the communication interface a signal representative of an intensity of a magnetic field detected by the second magnetic sensor and the corrected value of the signals thus computed.

According to a second aspect, the invention also proposes a method for detecting a target object using a detection system as described above, said detection method comprising the following steps:

S1: generating, by the first and/or the second magnetic sensor, a signal representative of an intensity of a magnetic field, S3: computing a corrected value of the signals generated by the first and the second magnetic sensor by applying an attenuation coefficient to the signals generated by the magnetic sensor or sensors during step S1, and S4: comparing the corrected value with a predetermined threshold value, and S5: when the corrected value is greater than the predetermined threshold value, sending instructions to generate an alarm.

Certain preferred but non-limiting aspects of the detection method described above are as follows, taken individually or in combination:

the method further comprises, prior to step S4, a step S2 of computing an average value of the corrected values, said average value of the corrected values being used for implementing the step S4.

the method further comprises, prior to step S3, a step S2 of computing an average value of the signals generated by the first and the second magnetic sensors, said average value being used for implementing the step S3.

the correction step S3 comprises the following sub-steps:

S31: determining a maximum value of the signal generated by the first magnetic sensor and the second magnetic sensor, S32: determining a minimum value of the signal generated by the first magnetic sensor and the second magnetic sensor, S32: calculating a ratio of the maximum value to the minimum value thus determined, S34: comparing the ratio with a first threshold and with a second threshold, the second threshold being higher than the first threshold, and S35: deducing the attenuation coefficient, the attenuation coefficient being equal to a first value when the ratio is less than the first threshold, to a second value different from the first value when the ratio is greater than the second threshold and at a value between the first value and the second value when the ratio is between the first threshold and the second threshold.

the attenuation coefficient is a linear function depending on the ratio when said ratio is between the first threshold and the second threshold.

the first value is equal to 1, the second value is equal to 0.1 and the attenuation coefficient is defined by the following function when the ratio is between the first threshold and the second threshold:

$$-0.03*R+1.9$$

where R is the value of the ratio.

the first detector comprises at least two first magnetic sensors and the second detector comprises at least two second magnetic sensors, each first magnetic sensor being associated with a given second magnetic sensor so as to form a pair, and wherein the steps S1 to S4 are applied to each pair.

the detection system further comprises a third detector, said third detector comprising at least one third magnetic sensor configured to detect a magnetic field and generate a signal representative of an intensity of the magnetic field thus detected, the detection method further comprising, prior to the step S5 of generating an alarm, a step of computing a corrected value of the signals generated by the second and third magnetic sensors by applying an attenuation coefficient to said signals generated by the second and third magnetic sensors.

the method further comprises, following the step of computing the corrected value of the signals generated by the second and third magnetic sensors, a step of deducing, on the basis of the corrected value of the signals generated by the first and second magnetic sensors and of the corrected value of the signals generated by the second and third magnetic sensors, the gate or gates formed by the first detector and the second detector, on the one hand, and the second detector and the third detector on the other hand, that have detected the magnetic field.

the step of deducing the gate or gates comprises the following sub-steps:

multiplying the corrected value computed on the basis of the signals of the second and third sensors by a safety coefficient, comparing the corrected value computed on the basis of the signals generated by the first and second sensors with the corrected value computed on the basis of the second and third sensors and multiplied by the safety coefficient, multiplying the corrected value computed on the basis of the signals of the first and second sensors by the safety coefficient, comparing the corrected value computed on the basis of the signals generated by the second and third sensors with the corrected value computed on the basis of the first and second sensors and multiplied by the safety coefficient.

the step S5 is only implemented by the first and second detectors if the corrected value computed on the basis of the signals generated by the first and second sensors is greater than the corrected value computed on the basis of the signals of the second and third sensors and multiplied by the safety coefficient.

the step S5 is only implemented by the second and third detectors if the corrected value computed on the basis of the signals generated by the second and third sensors is greater than the corrected value computed on the basis of the signals of the second and third sensors and multiplied by the safety coefficient.

the first detector and the second detector each comprise a processing unit, and wherein:
  the step of computing the corrected value of the signals generated by the second and third magnetic sensors is performed by the processing unit of the second detector,
  the step of computing the corrected value of the signals generated by the first and second magnetic sensors is performed by the processing unit of the first detector and
  the step of deducing the pair or pairs of detectors that have detected the magnetic field is performed by the processing unit of the second detector and by the processing unit of the first detector.

the detection system further comprises a fourth detector, said fourth detector comprising at least one fourth magnetic sensor configured to detect a magnetic field and generate a signal representative of an intensity of the magnetic field thus detected, the detection method further comprising the following sub-steps:
  computing a corrected value of the signals generated by the third and fourth magnetic sensors by applying an attenuation coefficient to said signals generated by the third and fourth magnetic sensors,
  multiplying the corrected value of the signals generated by the third and fourth magnetic sensors by the safety coefficient,
  comparing the corrected value of the signals generated by the second and third sensors with the corrected value of the signals generated by the third and fourth magnetic sensors multiplied by the safety coefficient,
  comparing the corrected value of the signals generated by the third and fourth sensors with the corrected value of the signals generated by the second and third magnetic sensors multiplied by the safety coefficient and
  deducing from the pair or pairs of detectors from among the first, second, third and fourth detectors that have detected the magnetic field.

the step S5 is only implemented by the second and the third detector if the corrected value of the signals generated by the second and third sensors is greater than the corrected value of the signals generated by the third and fourth magnetic sensors multiplied by the safety coefficient.

the step S5 is only implemented by the third and the fourth detector if the corrected value of the signals generated by the third and the fourth sensors is greater than the corrected value of the signals generated by the second and third magnetic sensors multiplied by the safety coefficient.

BRIEF DESCRIPTION OF THE DRAWINGS

Other features, aims and advantages of this invention will become more apparent on reading the following detailed description, and with reference to the appended drawings given by way of non-limiting example and wherein.

DETAILED DESCRIPTION OF AN EMBODIMENT

Figure 1:
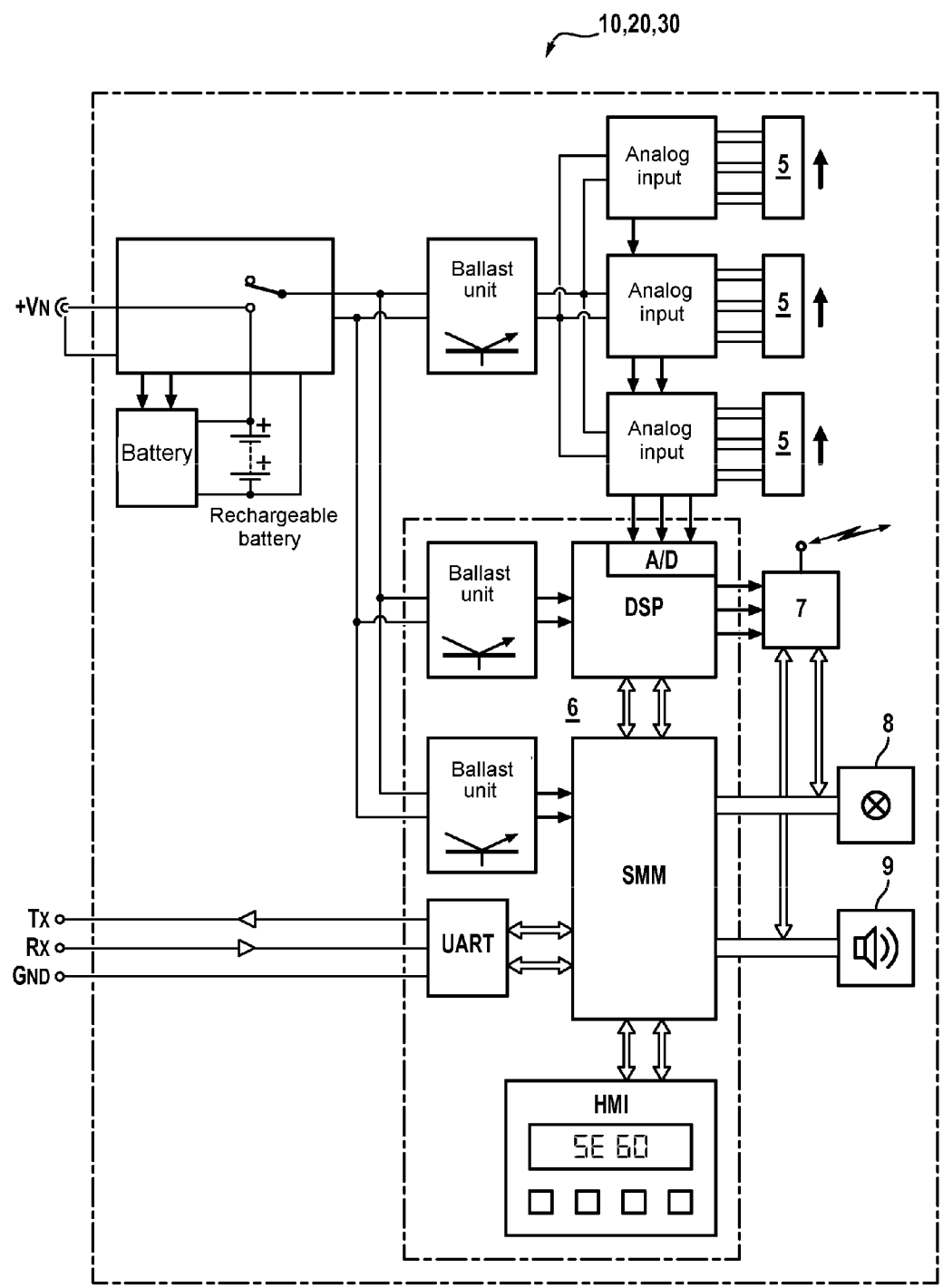
FIG. 1 is an overview illustration of an example of a detector that can be used in a detection system in accordance with the invention.
Figure 2:
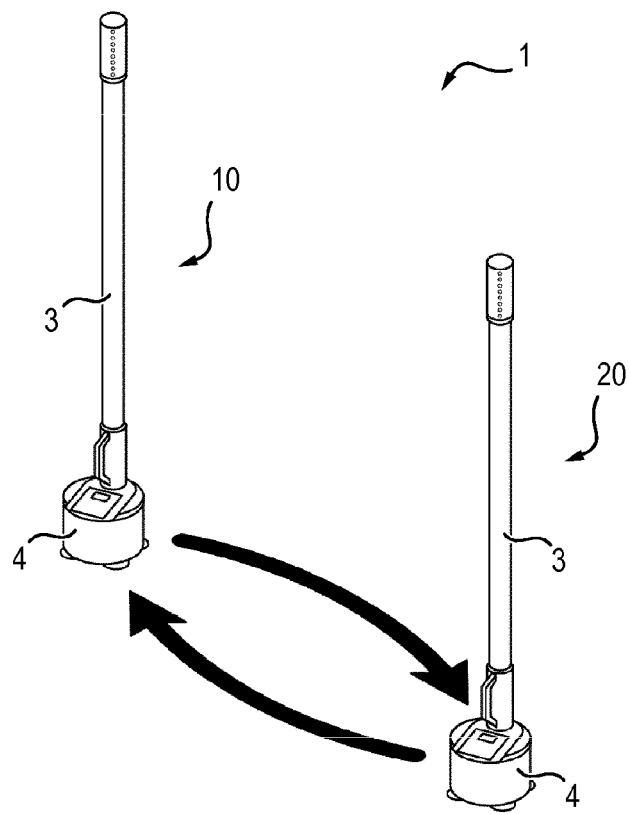
FIG. 2 illustrates an exemplary embodiment of a detection system in accordance with the invention comprising two detectors.

A system 1 for detecting a target object, and in particular an item comprising a ferromagnetic material of large volume such as an assault rifle, said system comprising:
  at least one first and a second detector 10, 20 together forming a gate,
  at least one processing unit 6 and
  at least one communication interface 7.

Each detector 10, 20 comprises at least one magnetic sensor 5. The term "magnetic" (or magnetostatic) is here understood to mean a passive sensor configured to detect a magnetic field that naturally surrounds objects containing iron or any ferromagnetic component, as opposed for example to an induction coil.

More precisely, the first detector 10 comprises at least one first magnetic sensor 5, preferably at least two, for example three first magnetic sensors 5, whereas the second detector 20 comprises at least a second magnetic sensor 5. Preferably the second detector 20 and the first detector 10 each comprise as many sensors 5.

Each magnetic sensor 5 is configured to detect a magnetic field and generate a signal representative of an intensity of the magnetic field thus detected. In an embodiment, the signal is a voltage, the value of which is proportional to the intensity of the magnetic field detected.

In an embodiment, each magnetic sensor 5 is configured to detect an intensity of a magnetic field along three orthogonal axes.

Each detector 10, 20 further includes a post 3, configured to be placed on a ground surface, for example via a base 4. Preferably, one height of the post 3 is substantially equal to the average height of a person 2, for example in the order of 1.70 m to 2.0 m.

The assembly formed by the post 3 and its base 4 is portable, i.e. it is not definitively anchored in the ground and can be transported by an operator. Where applicable, each detector 10, 20 can be equipped with a handle in order to facilitate its transportation. The handle can in particular be attached to the base 4.

The magnetic sensors 5 are distributed over the height of the post 3 in order to ensure the detection of target objects between the feet and the head of the persons 2 inspected. For example, each post 3 can be equipped with three magnetic sensors 5, distributed between the base 4 and the free end of the post 3.

Finally, within one and the same detection system 1, the magnetic sensors of the detectors 10, 20 are positioned pairwise at one and the same height so as to form pairs of sensors 5 facing one another.

The system 1 further comprises at least one processing unit 6 configured to receive the signals representative of an intensity of a magnetic field generated by the first magnetic sensor 5 and/or the second magnetic sensor 5. The processing unit 6 then determines a corrected value of the signals generated by the magnetic sensors 5 of the first and second detectors 10, 20 by applying an attenuation coefficient to the signals generated by the magnetic sensor or sensors 5 during the step S1 and, when said corrected value is greater than a predetermined threshold value, sends instructions to emit an alarm.

In an embodiment, the processing unit 6 computes an average value of the signals generated by the magnetic sensors 5 of the first and second detectors 10, 20 and then applies the correction step to this average value. Alternatively, the processing unit 6 can first determine the corrected value of these signals then compute the average value of these corrected values.

The processing unit 6 can determine an arithmetic mean value of the signals, which corresponds to the sum of the values of the signals divided by the number of signals, or in a variant a geometric mean value of the signals, which corresponds to the square root of the product of the signals.

In an embodiment, the processing unit 6 can be incorporated into one from among the first detector 10 and the second detector 20. Preferably, each detector 10, 20 comprises an integrated processing unit 6. The term "integrated" should be understood to mean that the processing unit 6 is part of the detector 10, 20 and is not a separate component to which the system 1 is connected.

In this embodiment, the processing unit 6 can for example be attached to the post 3 of the associated detector, or in a variant its base 4.

In a variant of this embodiment, the processing unit 6 can be placed at a distance away from the first and the second detector 10, 20. The detectors 10, 20 then communicate to it the signals generated by their magnetic sensors 5 for the purpose of processing the signals by way of their communication interface 7.

In an embodiment, the processing unit 6 can comprise:
- an analog-to-digital converter A/D, configured to convert an analog (voltage) signal generated by a magnetic sensor 5 into a digital signal
- a Digital Signal Processor DSP, configured to produce the digital signal thus converted and
- a System Management Microcomputer SMM, configured to receive the digital signal produced by the DSP and compare it to the predetermined threshold value.

The SMM is connected to at least one emitter 8 configured to generate an alarm signal, for example an acoustic emitter 8 configured to generate an acoustic signal and/or a light configured to generate an optical signal (LED, flashing light etc.) The emitter 8 can be contained in the detector 10, 20 or in a variant be worn by an operator (earpiece etc.) in which case the processing unit 6 sends the instructions to generate an alarm to the remote emitter 8 by way of the communication interface 7 of the corresponding detector 10, 20.

The SMM is moreover connected to an asynchronous interface UART in order to allow the connection of the processing unit 6 to a computer (or equivalent) to permit various actions including control of the detection program, diagnostics on one or more detectors, loading of updates etc.

Finally, the SMM is connected to a Human Machine Interface HMI.

Each detector 10, 20 of the detection system 1 further comprises a communication interface 7 configured to allow one of the detectors 10, 20 of the system 1 to communicate with another of the detectors 20, 10 of the system 1 and transmit to it the signal generated by its magnetic sensor or sensors 5. For each detector 10, 20, the communication interface 7 can be connected either to the DSP (as illustrated in FIG. 1) of the processing unit 6 of this detector 10, 20, or to its SMM and to its alarm emitters 8.

The communication interface 7 preferably comprises a wireless interface to facilitate the installation of the detection system 1, for example an interface of Wi-Fi or Bluetooth type, by optical, radio, infra-red or else inductive communication, etc. In a variant, the communication interface 7 can be wired.

Where applicable, the detection system 1 can comprise a larger number of detectors in order to form a set of gates, each gate being formed by two adjacent detectors. Preferably, the detectors of one detection system 1 are substantially identical pairwise.

For example, the detection system 1 can include a third detector 30 comprising at least one third magnetic sensor 5 configured to detect a magnetic field and generate a signal representative of an intensity of the magnetic field thus detected.

In a similar way as the first and the second detectors 10, 20, the third detector 30 can include a post 3 attached to a base 4 and equipped with the third magnetic sensor or sensors 5 as well as a communication interface 7 and where applicable a processing unit 6.

In order to form several gates, the invention proposes to place side-by-side the first detector 10, the second detector 20 and the third detector 30 so as to form two gates. More precisely, the first gate is formed by the first detector 10 and the second detector 20, whereas the second gate is formed by the second detector 20 and the third detector 30. In the system, one same detector (here, the second detector 20) is therefore used for the forming of two separate gates, which makes it possible to significantly reduce the bulk of the detection system 1 by comparison, for example, with the system proposed in the document WO 2017/141022. The system is furthermore easier to install.

As will be seen below, such a configuration is allowed by the fact that the processing unit 6 of the second detector 20, which is located between the first detector 10 and the second detector 20, can be configured both to process the signals generated by the magnetic sensor or sensors 5 of the third detector 30 and to communicate with the first detector 10, so that the detection system 1 is capable of determining the gate within which a target object has been detected, even though the magnetic sensors 5 carry out a scalar and not a vectorial detection.

More precisely, the processing unit 6 of the second detector 20 is configured to:

(i) compute a corrected value (where applicable averaged) or an average value of the signals generated by the second and third magnetic sensors 5 and,
(ii) when said computed value is greater than the predetermined threshold value, transmitting to the processing unit 6 of the first detector 10 via the communication interface 7 a signal representative of an intensity of a magnetic field detected by the second magnetic sensor or sensors 5 as well as the computed value.

Of course, an operator can also use four detectors in accordance with the invention to form two gates, the sharing of the second detector 20 not being obligatory for the detection of target objects.

Each detector 10, 20 can further include identifying means and a memory in order to allow association and communication with the other detectors of the detection system 1 as well as the implementation of the detection method S. For example, to each detector 10, 20, 30 can be assigned an address, which can be set when the detector 10, 20, 30 are manufactured or programmed when the detectors 10, 20, 30 forming the detection system 1 are paired. In an embodiment, the address of each detector 10, 20, 30 is fixed, i.e. non-modifiable, in order to limit errors of manipulation of the detection system 1 and to facilitate after-sales service.

An example of an address can comprise a character chain that can in particular be formed from a given number of hexadecimal pairs, for example eight.

When the detectors 10, 20, 30 of the detection system 1 are paired, the address of the detectors with which a given detector forms a gate is stored in the memory of said given detector. For example, in the case of a detection system 1 comprising the first 10, the second 20 and the third 30 detector, at the time of parameterization of the detection system 1:

the address of the second detector 20 is stored in the memory of the third detector 30
the address of the first and third detectors 30 is stored in the memory of the second detector 20 at the time of parameterization of the detection system 1 and
the address of the second detector 20 is stored in the memory of the first detector 10.

An example of a detection method S using a detection system 1 in accordance with the invention and comprising two detectors 10, 20 will now be described.

In order to facilitate the reading of the description, the detection system 1 comprises a first detector 10 and a second detector 20 including two first magnetic sensors 5 and two second magnetic sensors 5 respectively. The first and second magnetic sensors 5 form two pairs of magnetic sensors 5, each pair comprising a first sensor 5 and a second sensor 5. Preferably, a pair comprises a first magnetic sensor 5 and a second magnetic sensor 5 each placed near a free end of the post 3 of the first detector 10 and of the second detector 20, whereas the other pair comprises a first magnetic sensor 5 and a second magnetic sensor 5 each placed near their base 4.

Both detectors are identical and each comprise a processing unit 6 and a communication interface 7.

Of course, the invention applies mutatis mutandis in the case where the detectors comprise a different number of magnetic sensors 5. In particular, the detectors could comprise only a single magnetic sensor 5, or more than two magnetic sensors 5 (for example three magnetic sensors 5). In addition, the second detector 20 could comprise no processing unit 6, or in a variant the processing unit 6 could be placed at a distance from the detectors instead of being housed in the first detector 10.

During a preliminary step, the first and second detector 10, 20 are paired to associate them and configured so as to assign to each a function in the detection method S. For example, the first detector 10 can be configured as the master detector whereas the second detector 20 is configured as the slave detector. The "master detector" of a given gate is understood to mean the detector of which the processing unit 6 is configured to compute the corrected value and/or the average value of the signal, whereas the term slave detector should be understood to mean the other detector of said given gate.

During a first step S1, at least one from among the first and second magnetic sensors 5 generates a signal representative of an intensity of a magnetic field.

In practice, when a magnetic field is detected by one of the magnetic sensors 5 of the detection system 1, all the magnetic sensors 5 of said system generate a signal representative of an intensity of the magnetic field detected, only the power of the signal of each sensor 5 being different.

The signals generated by the first and second magnetic sensors 5 are transmitted to the processing unit 6, where applicable by way of the communication interfaces 7 of the first detector 10 and/or of the second detector 20. In our example, the first detector 10 being the master and comprising the processing unit 6, the signals of the second magnetic sensors 5 are transmitted to the first detector 10 by the communication interface 7 of the second detector 20, whereas the signals of the first magnetic sensors 5 may be transmitted directly thereto by the first magnetic sensors 5.

During a step S3, the processing unit computes a corrected value of the signals generated by each of the magnetic sensors 5 by applying an attenuation coefficient to said signals. Here, the processing unit 6 therefore computes a first corrected value corresponding to a first of the pairs of first and second magnetic sensors 5, and a second corrected value corresponding to the second of the pairs.

This so-called correction step S3 thus makes it possible to attenuate the signals generated by the magnetic sensors 5 of the detection system 1 by applying a correction coefficient to the signals depending on the value of these signals. More precisely, the purpose of the correction is to attenuate the signal when the target object is near one of the detectors 10, 20, where the sensitivity is greater, in order to reduce its weight in the detection.

To do this, during the sub-steps S31 and S32, for each pair of magnetic sensors 5, the processing unit 6 determines the maximum value and the minimum value from among the signals generated by the first magnetic sensor 5 and the second magnetic sensor 5 at a given time.

During a third sub-step S33, the processing unit 6 computes a ratio of the maximum value to the minimum value thus determined, then, during a fourth sub-step S34, compares the ratio with determined thresholds and deduces therefrom the value of the attenuation coefficient to be applied to the value of the signals.

For example, the processing unit 6 can in particular compare the ratio with a first threshold and with a second threshold, the second threshold being greater than the first threshold, and deduce the attenuation coefficient from it.

Thus, the attenuation coefficient can be equal to:
a first value when the ratio is less than the first threshold,
a second value less than the first value when the ratio is greater than the second threshold and
a value between the first value and the second value when the ratio is between the first threshold and the second threshold. In particular, the attenuation coefficient can be a linear function depending on the ratio when said ratio is between the first threshold and the second threshold.

The use of the ratio between the maximum value and the minimum value makes it possible to determine if the target object that generates a magnetic field or disrupts the Earth's electromagnetic field is placed near one of the detectors. In this case, the value of the ratio is greater than the second threshold and the attenuation coefficient that is applied is equal to the second value, which is less than the first value. Contrariwise, when the target object is centered between the two detectors, the sensitivity of the gate in this zone is lower. This manifests as a ratio of the maximum value to the minimum value which is also lower. The attenuation coefficient can therefore be higher and the resulting attenuation coefficient lower.

A relative virtual uniformity between the two detectors is thus obtained.

By way of non-limiting example, the first threshold can be equal to 30, the second threshold can be equal to 60, the first value can be equal to 1, the second value can be equal to 0.1 and the attenuation coefficient can be defined by the following function when the ratio is between the first threshold and the second threshold:

$$-0.03*R+1.9$$

where R is the value of the ratio.

In other words, the attenuation coefficient can be equal to 1 when the ratio is less than 30, 0.1 when the ratio is greater than 60, and 0.03*R+1.9 when the ratio is between 30 and 60.

In a variant embodiment, instead of computing a corrected value of the signals of each pair of magnetic sensors 5, the processing unit 6 of the master detector can compute an average value of the signals generated by each pair of magnetic sensors 5 (step S2). Here, the processing unit 6 therefore computes a first average value corresponding to a first of the pairs of first and second magnetic sensors 5, and a second average value corresponding to the second of the pairs.

Of course, when the detectors each only comprise a single sensor 5, the processing unit 6 only computes a single average value in the step S2 corresponding to the average value of the signals of these two magnetic sensors 5.

As indicated above, the processing unit 6 can compute an arithmetic mean value of the signals or, in a variant, a geometric mean value.

In another variant embodiment, the processing unit 6 computes an average value of the signals for each pair of magnetic sensors 5 (step S2) and implements a step of correcting said signals (step S3).

To do so, after computing the average of the signals of each pair of magnetic sensors 5 (step S2), the processing unit 6 can apply an attenuation coefficient to the average values thus computed (step S3).

Alternatively, the processing unit 6 can first apply the attenuation coefficient to the signals of each pair of magnetic sensors 5 (step S3) then compute an average of the corrected signals of each pair of magnetic sensors 5 (step S2, applied to the corrected signals and not to the signals generated by the magnetic sensors 5).

The attenuation coefficient can be identical to that which has been previously described (equal to the first value, the second value or a function of the ratio, according to the value of the ratio).

During a fifth step S5, the processing unit 6 compares the computed value with a predetermined threshold value.

The computed value used by the processing unit 6 during the fifth step S5 can be either the corrected value of the signals generated by the pairs of magnetic sensors 5 and obtained in the step S3, or the value corrected and averaged by applying an attenuation coefficient by implementing the step S2. When the corrected value, where applicable the corrected and averaged value, is greater than the predetermined threshold value, during a sixth step S6, the processing unit 6 sends instructions to emit an alarm (optical, sonic etc.) to at least one of the emitters 8. Preferably, the processing unit 6 sends instructions to emit an alarm to the emitters 8 of the first detector 10 and the second detector 20 (via the communication interfaces 7), such that one or more alarms are emitted on both sides of the gate. In a variant, only the emitter or emitters 8 of the one of the detectors 10, 20 can receive the emitting instructions of the processing unit 6.

Alternatively, when the processing unit 6 determines only a corrected value of the signals, without taking the average thereof, it is the sum of the corrected values of the signals (and not their average) which is compared during the step S5 with the predetermined threshold value. Of course, the signals generated by the sensors 5 can first be summed before the correction step S3 is applied to them.

Alternatively, instead of computing the sum of the corrected values of the signals, the processing unit 6 can determine the maximum value of the corrected signals and compare, during the step S5, the maximum value thus determined with the threshold value. In a similar way to that described previously, it is possible to first determine the maximum value of the signals generated by the sensors 5 then apply to this maximum value the correction step S3.

In this alternative, the processing unit 6 compares the sum of the corrected values (or the corrected maximum value respectively) of the signals of one and the same pair of magnetic sensors 5 with the predetermined threshold value. When this sum (or this corrected maximum value respectively) is greater than the predetermined threshold value, during the sixth step S6, the processing unit 6 sends instructions to emit an alarm (optical, audible etc.) to the at least one of the emitters 8. As indicated previously, the processing unit 6 can send instructions to emit an alarm to the emitters 8 of the first detector 10 and/or the second detector 20.

Figure 8A:
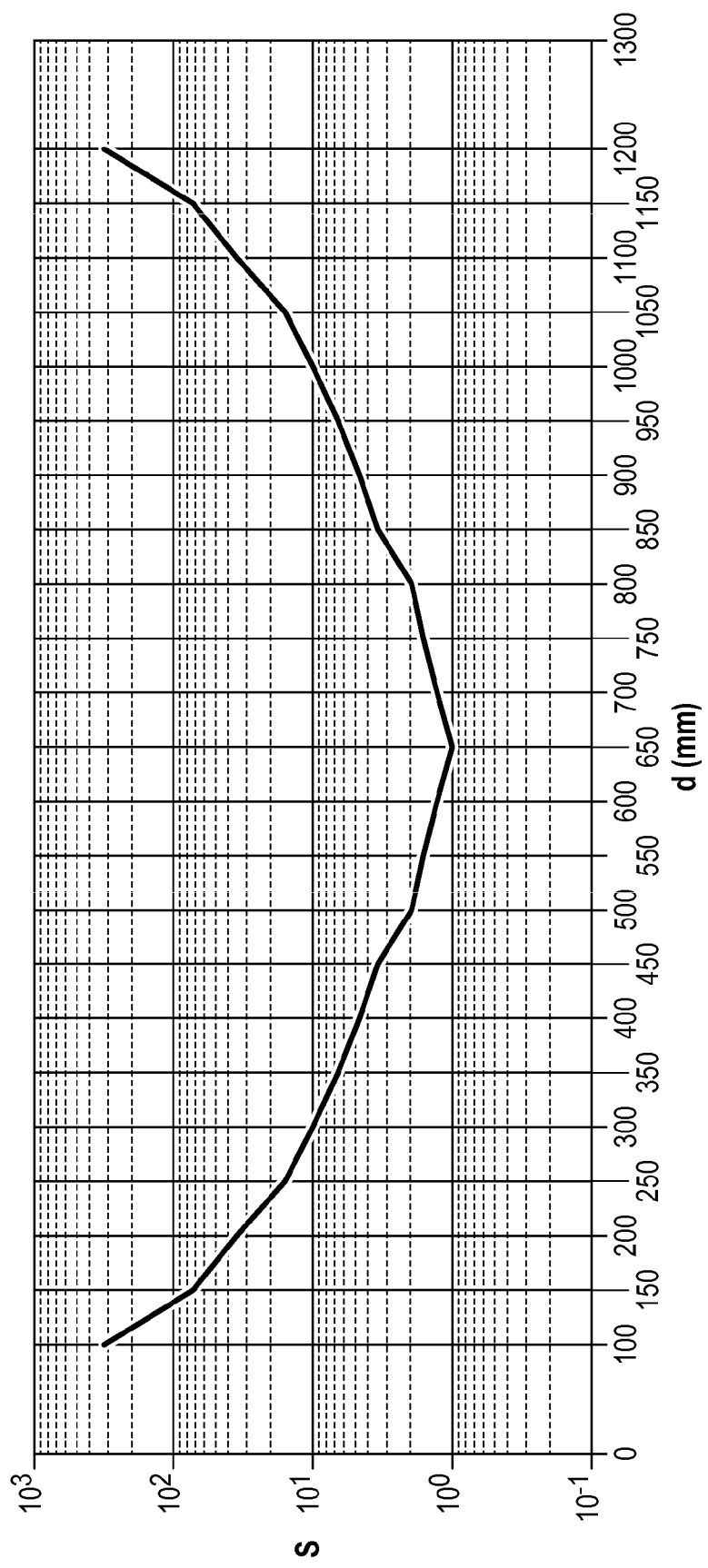
FIG. 8a illustrates the intensity of the signal of a detection system in accordance with the prior art and comprising two detectors separated by a distance of 130 cm.
Figure 8B:
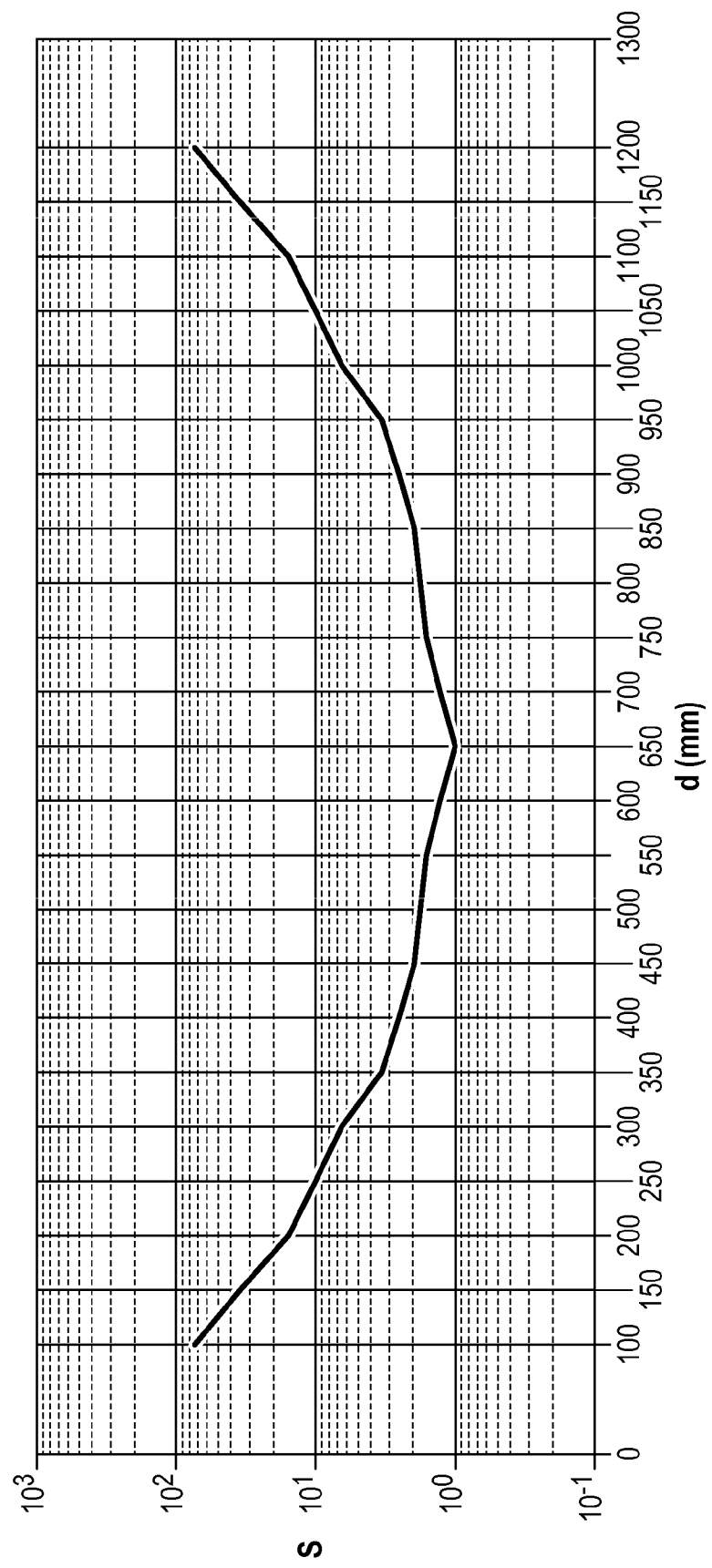
FIG. 8b illustrates the intensity of the signal of a detection system in accordance with an embodiment of the invention comprising two detectors separated by a distance of 130 cm and comprising a processing unit configured to compute an average value of the signals generated by the sensors of the two detectors.
Figure 8C:
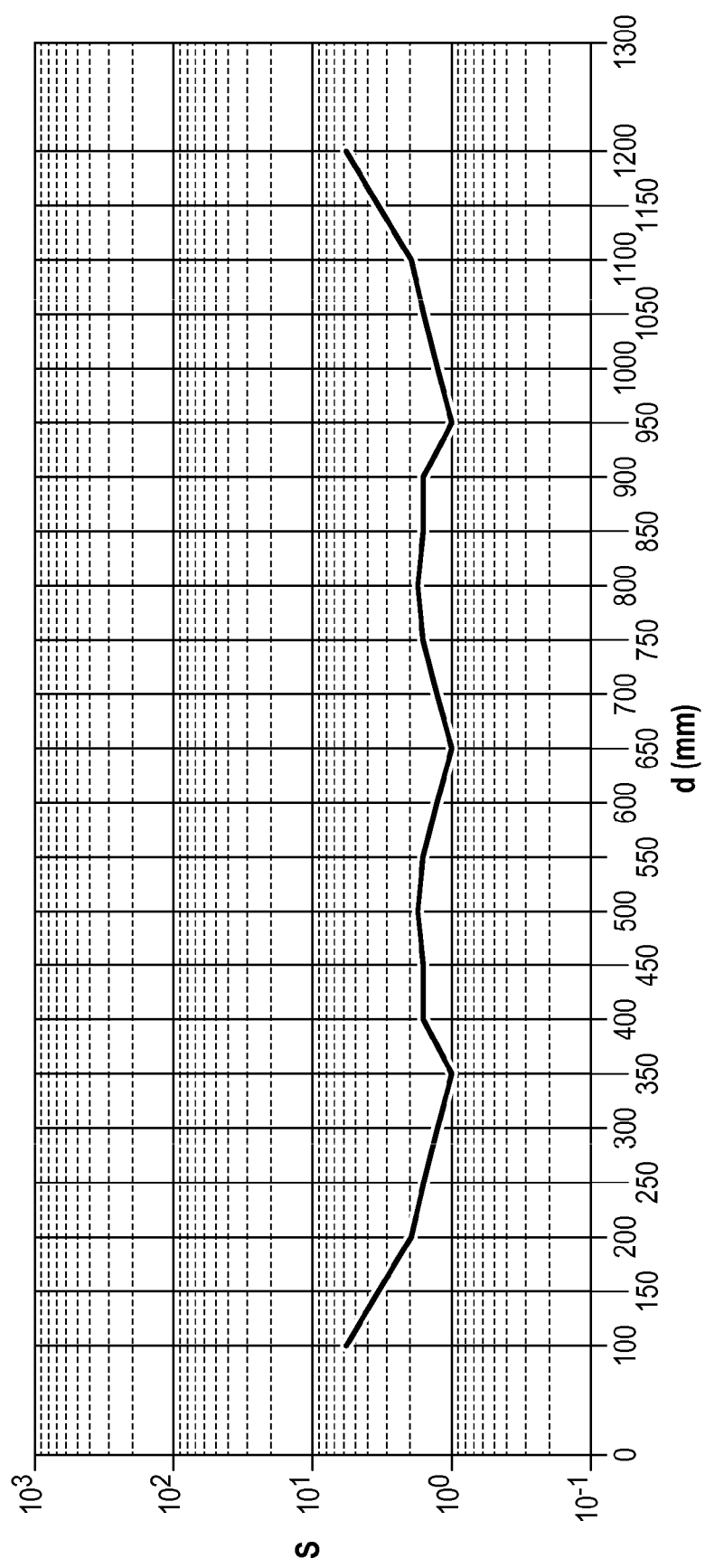
FIG. 8c illustrates the intensity of the signal of a detection system 1 in accordance with an embodiment of the invention comprising two detectors separated by a distance of 130 cm and comprising a processing unit configured to compute an average value of the signals generated by the sensors of the two detectors.

FIGS. 8a, 8b and 8c illustrate the intensity of the measured signal for four detection systems as a function of the distance with respect to the detector(s).

FIG. 8a illustrates the case of a detection system in accordance with the prior art comprising two detectors separated by a distance of 130 cm. In this figure, the intensity represented corresponds to the maximum value of the signals generated by the sensors of the two detectors.

FIG. 8b illustrates the case of a detection system 1 in accordance with an embodiment of the invention comprising two detectors separated by a distance of 130 cm and comprising a processing unit. In this figure, the intensity represented corresponds to the average value of the signals generated by the sensors of the two detectors.

FIG. 8c illustrates the case of a detection system 1 in accordance with an embodiment of the invention comprising two detectors separated by a distance of 130 cm and comprising a processing unit. In this figure, the intensity represented corresponds to the corrected average value of the signals generated by the sensors of the two detectors.

It is clearly apparent from this figure that the computing of the average value and, where applicable, the application of the attenuation coefficients during the step of correcting the average value, make it possible to uniformize the intensity of the signal between the two detectors of the detection system, by comparison with the simple determination of the maximum values of the signals (FIG. 8a).

EXAMPLE

The table below is a comparative example of detection of one same target object by three configurations of detection system, namely (i) a detection system 1 comprising only a single detector, (ii) a detection system 1 in accordance with a first embodiment of the invention and comprising two detectors spaced apart by 130 cm with computation of the average value of the signals and (iii) a detection system 1 in accordance with a second embodiment of the invention and comprising two detectors spaced apart by 130 cm with computation of the average value of the signals and correction of said average value to determine if an alarm must be triggered.

In this example, the sensitivity SE of the three configurations of detection system has been set to 85% (equivalent to 1400 mV). In other words, the sensitivity has been set such that the predetermined threshold value is equal to 1400 mV. The systems have been parametrized such that at this sensitivity, the passing of a sphere of 75 mm in diameter at a height of one meter from the ground does not generate any alarm when it passes at 65 cm from the single detector (first configuration (i)) or in the middle of the two detectors (second and third configuration (ii) (iii)). In other words, the diameter of 75 mm is a limit diameter of detection by the tested systems. Specifically, the disruption of the electromagnetic field of an iron sphere of 75 mm in diameter substantially corresponds to the disruption generated by the presence of an assault rifle of AK47 type at the center of the gate.

| Distance between the sphere and one of the detectors [cm] | Limit diameter [mm] (i) Single detector | Limit diameter [mm] (ii) System with two detectors with computation of the average value | Limit diameter (iii) System with two detectors with computation of the average value and correction of the average value |
| --- | --- | --- | --- |
| 10 | 11 | 18 | 35 |
| 15 | 18 | 23 | 50 |
| 20 | 23 | 30 | 60 |
| 25 | 30 | 35 | 64 |
| 30 | 35 | 40 | 69 |
| 35 | 40 | 50 | 75 |
| 40 | 45 | 55 | 64 |
| 45 | 50 | 60 | 64 |
| 50 | 60 | 62 | 62 |
| 55 | 64 | 64 | 64 |
| 60 | 69 | 69 | 69 |
| 65 | 75 | 75 | 75 |

In this table, "limit diameter [mm]" corresponds to the minimum diameter in millimeters from which the detection system 1 tested emits an alarm signal.

The tests show that, in the case where the detection system 1 comprises two detectors forming a gate (configurations (ii) and (iii)) and the processing unit 6 computes the average value of the signals generated by the magnetic sensors 5 of these detectors, it is capable of discriminating target objects with a magnetic field equivalent to that of an iron sphere of approximately 62 mm from objects of smaller size such as smartphones, even if the target object is 50 cm away from one of the detectors (which, in practice, is already quite far from the center of the passage, the detectors being spaced apart by 130 cm during this test).

In the case where the processing unit 6 of the detection system 1 further applies a correction step S2 to the average value of the signals (configuration (iii)), the detection system 1 is further capable of distinguishing target objects with a magnetic field equivalent to that of an iron sphere of approximately 64 mm, even if the target object is 25 cm away from one of the detectors (i.e. very close to it, since the detectors are spaced 130 cm apart during this test).

The detection systems in accordance with the invention (configurations (ii) and (iii)) are therefore capable of discriminating objects of small size, even if these comprise magnetic components (such as smartphones), from target objects of large volume such as assault rifles, even if the passing of the inspected person 2 is not centered between the detectors.

The invention also applies to the case where the detection system 1 comprises a number of detectors greater than or equal to three so as to form a plurality of gates and where two adjacent gates share one and the same detector. An example of a method for detecting a target object using such a detection system 1 will now be described.

Figure 3:
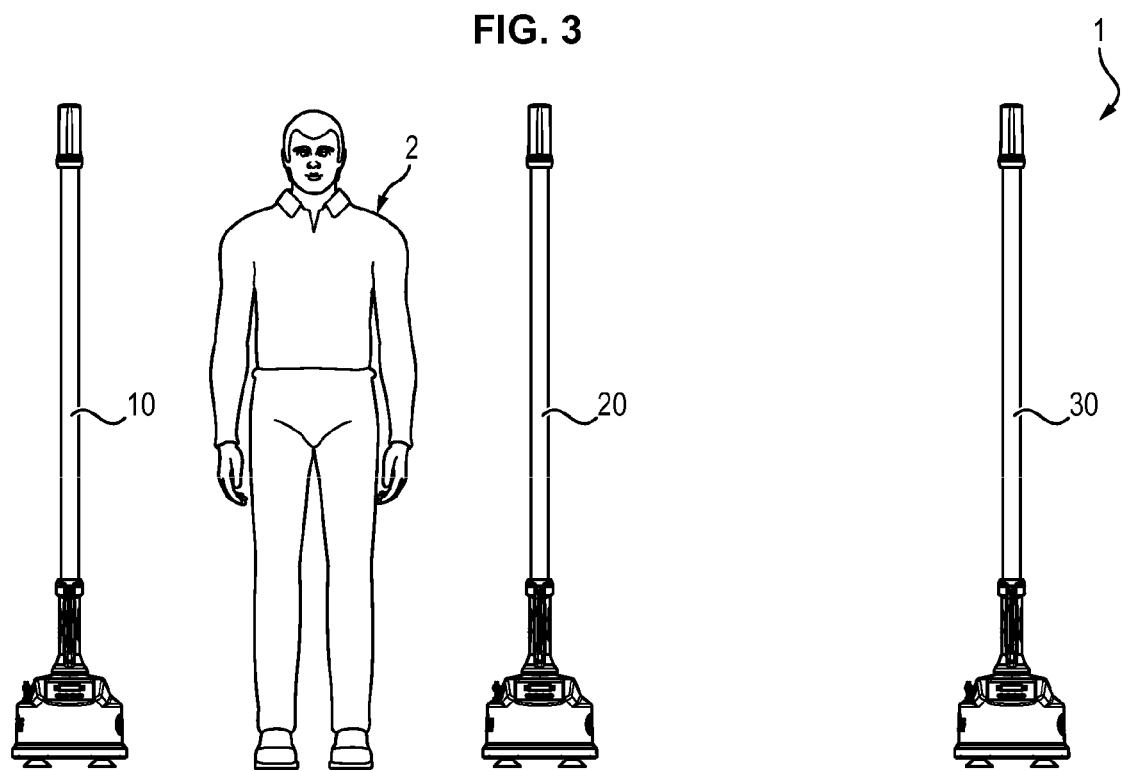
FIG. 3 illustrates an exemplary embodiment of a detection system in accordance with the invention comprising three detectors together forming two gates, a person being inspected within one of the gates.
Figure 4:
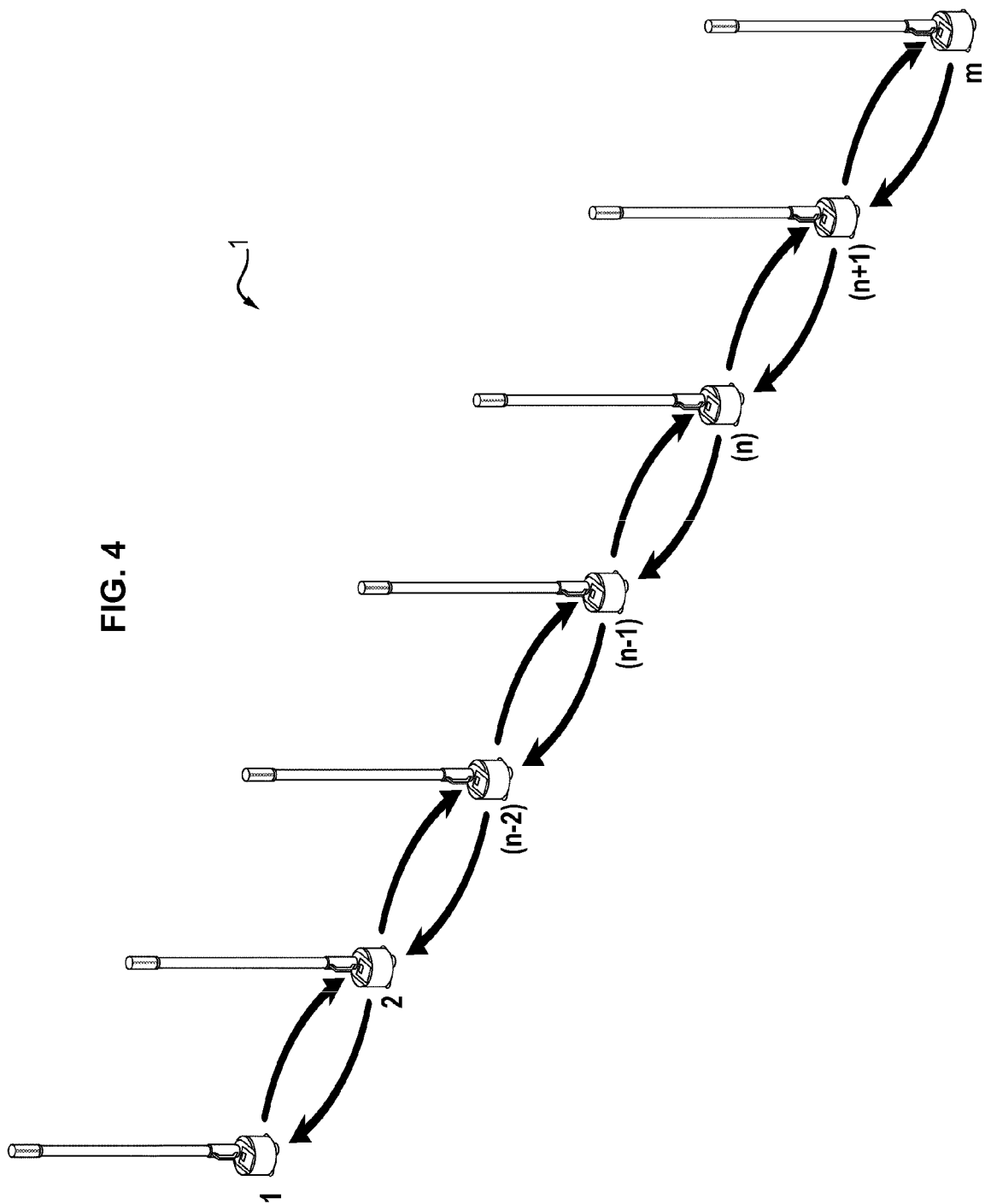
FIG. 4 illustrates an exemplary embodiment of a detection system in accordance with the invention comprising m detectors together forming m−1 gates.
Figure 5:
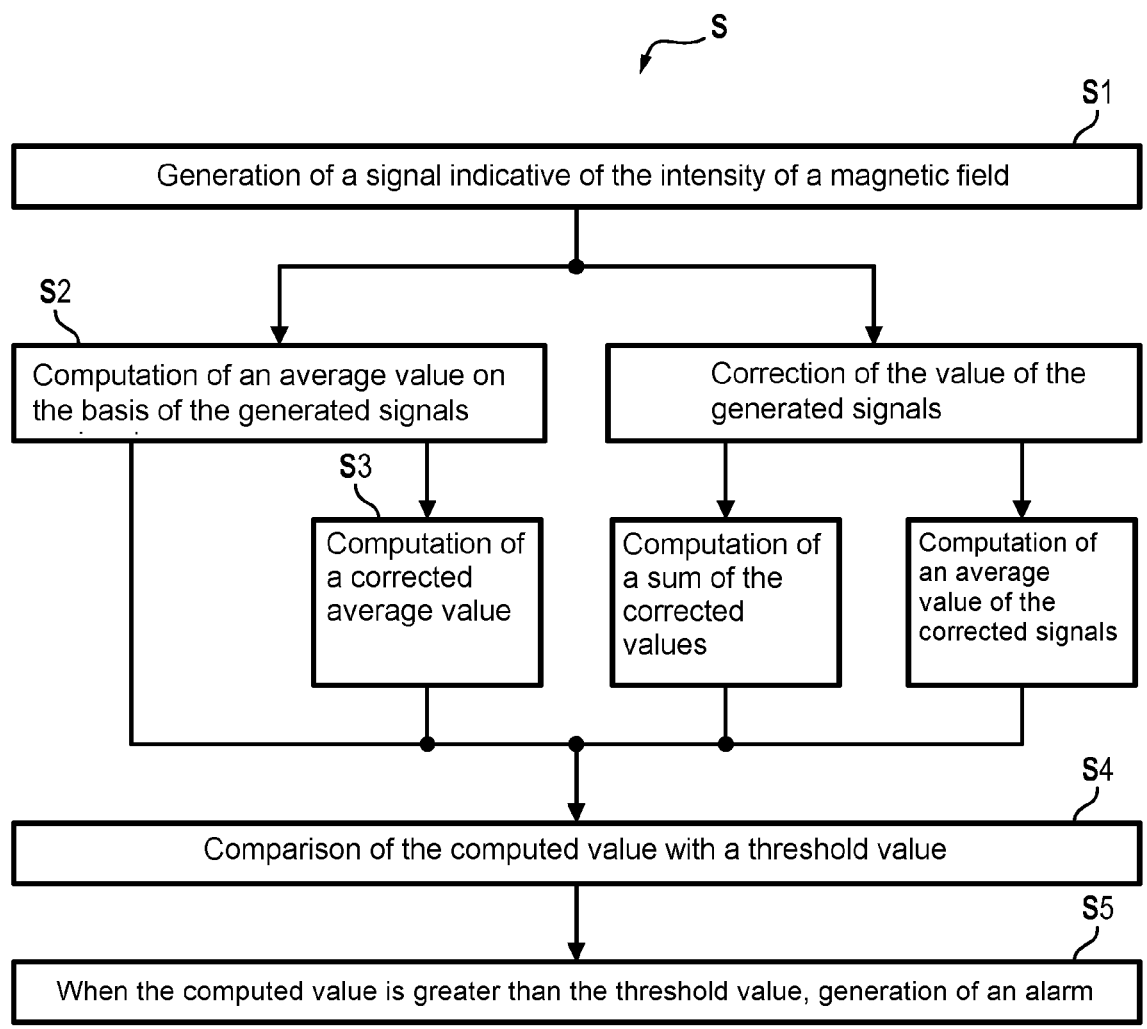
FIG. 5 is a block diagram illustrating the general steps of an example of a detection method in accordance with the invention.
Figure 6:
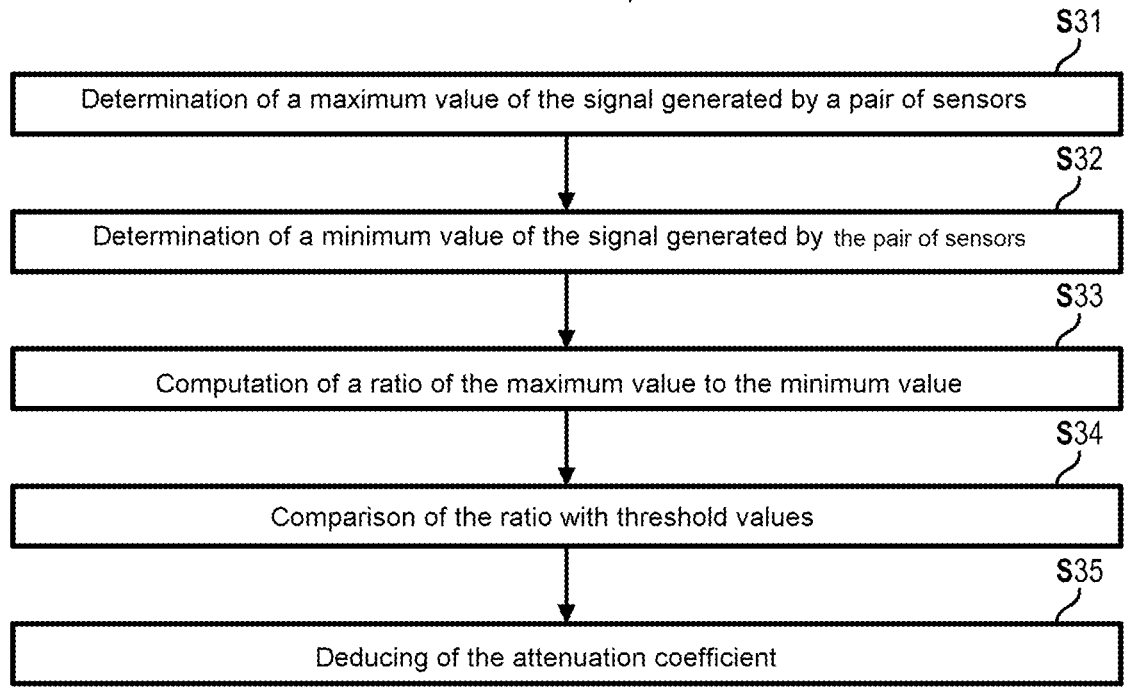
FIG. 6 is a block diagram illustrates the sub-steps of correcting the value of the signals.

In order to facilitate the reading of this embodiment, the detection system 1 comprises three detectors each including two magnetic sensors 5 (FIG. 3). In other words, the detection system 1 includes a first, a second and a third detector 10, 20, 30, including two first, two second and two third magnetic sensors 5 respectively. The second detector 20 forms a first gate with the first detector 10 and a second gate with the third detector 30. The second detector 20 is therefore located between the first detector 10 and the third detector 30.

The three detectors are identical and therefore each comprise a processing unit 6 and a communication interface 7. Of course, the processing unit 6 could in a variant be placed at a distance from the detectors and not be incorporated into the detectors. In this case, the signals generated by the magnetic sensors 5 of a given detector are transmitted to the remote processing unit 6 by way of the communication interfaces 7 of the detectors so that it applies the detection algorithm to them and then transmits any instructions to generate an alarm to the emitters 8 of the detectors, via their detectors, via their respective communication interfaces 7.

Of course, the invention applies mutatis mutandis in the case where the system only comprises two detectors together forming a single gate or a greater number of detectors (for example n detectors, n being an integer number) together forming n−1 gates. The detectors could further only comprise a single magnetic sensor 5, or more than two magnetic sensors 5 (for example three magnetic sensors 5).

During a preliminary step, the first, the second and the third detector 10, 20, 30 are paired to associate them and configured so as to assign to each a function in the detection method S. For example, for the first gate, the first detector 10 can be configured as the master detector whereas the second detector 20 is configured as the slave detector. For the second gate, the second detector 20 is configured as the master detector whereas the third detector 30 is configured as the slave detector. During the pairing, the means of identification of each detector of the system (typically, their address) are also entered and stored in the memory of each of the adjacent detectors. Thus, the means of identification of the first detector 10 are entered into the second detector 20 whereas the means of identifying the second detector 20 are entered into the first detector 10 so as to permit their pairing. In the same way, the means of identifying the second detector 20 are entered into the third detector 30, whereas the means of identifying the third detector 30 are entered into the second detector 20.

During a first step, one at least from among the first, second and third magnetic sensors 5 detects a magnetic field and generates a signal representative of an intensity of the magnetic field thus detected.

In practice, all the magnetic sensors 5 of one same gate generate, continuously or periodically, a signal representative of an intensity of a magnetic field, only the power of the signal generated by each sensor 5 being different.

In the remainder of the text, an example wherein a signal is generated by the two second magnetic sensors 5 and the two third magnetic sensors 5 is described to illustrate the steps of the method S.

The signal generated by the magnetic sensors 5 is then transmitted to the processing unit 6 of the master detector of the gate in question, where applicable by way of communication interfaces 7. In the example described, the signal generated by the three magnetic sensors 5 is transmitted by the communication interface 7 of the third detector 30 to the processing unit 6 of the second detector 20. The signal generated by the second magnetic sensors 5 is itself transmitted directly to the processing unit 6 of the second detector 20 (bearing in mind that it would be transmitted via its communication interface 7 should the processing unit 6 be external).

During a second step, the processing unit 6 of the master detector of the concerned gate, here the second detector 20, computes a corrected value (step S3) of the signals generated by each of the magnetic sensors 5 by applying an attenuation coefficient to said signals. Here, the processing unit 6 therefore computes a first corrected value corresponding to a first of the pairs of second and third magnetic sensors 5 and a second corrected value corresponding to the second of the pairs.

Then, the processing unit 6 computes a value corresponding to the sum of the values of the signals thus corrected (or in a variant determines the maximum value of the corrected signals, for each pair of sensors 5). This correction step having already been described above in relation to the sub-steps S31 to S35, it will not be further detailed here.

Alternatively, instead of computing a corrected value of the signals of each pair of magnetic sensors 5, the processing unit 6 can compute an average value PGS[2, 3] of the signals generated for each pair of magnetic sensors 5. Here, the processing unit 6 therefore computes a first average value corresponding to a first of the pairs of second and third magnetic sensors 5 and a second average value corresponding to the second of the pairs.

Of course, when the detectors each comprise only a single sensor 5, the processing unit 6 computes only a single average value corresponding to the average value of the signals of these two magnetic sensors 5.

As indicated above, the processing unit 6 can compute an arithmetic mean value of the signals or, in a variant, a geometric mean value.

In another variant, the processing unit 6 can at once compute an average value of the signals for each pair of magnetic sensors 5 and implement a step of correcting said signals, as described above so as to obtain a corrected average value.

In a similar way to that already described, the correction step S2 can be applied either to the signals generated by the sensors 5, or to the sum of the signals (or to their maximum value), or to the average value of the signals.

During a third step, when one of the values PGS[2, 3] computed in the second step is greater than the predetermined threshold value, the processing unit 6 of the second detector 20 transmits to the processing unit 6 of the first detector 10 on the one hand said computed value PGS[2, 3] and on the other hand the signals generated by its second magnetic sensors 5.

During a fourth step, simultaneous with the third step, the processing unit 6 of the first detector 10 computes a value PGS[1, 2] on the basis of the signals generated for each pair of magnetic sensors 5 of the first gate. The computation of the value carried out by the processing unit 6 of the first detector 10 is the same as that carried out by the processing unit 6 of the second detector 20. In other words, when one of the master detectors computes a corrected value (corresponding to the sum of the corrected values, to a maximum corrected value or else to a corrected and averaged value respectively), the other master detectors carry out the same computation (sum of the corrected values, a maximum corrected value or else a corrected and averaged value, respectively).

Here, the processing unit 6 of the first detector 10 computes, for example, a first corrected average value corresponding to a first of the pairs of first and second magnetic sensors 5, and a second corrected average value corresponding to the second pair so as to obtain corrected average values of the signals.

When the value PGS[1, 2] computed by the first detector 10 is less than the predetermined threshold value, the processing unit 6 of the first detector 10 does not send any instructions to generate an alarm to the emitters 8 of the first detector 10 or of the second detector 20.

On the other hand, when the value PGS[1, 2] computed by the first detector 10 is greater than the predetermined threshold value, during a fifth step, the processing unit 6 of the first detector 10, as master detector of the first gate, determines if the target object has been detected by the first gate (formed by the first and the second detector 10, 20) or by the second gate (formed by the second and the third detector 20, 30).

To do this, the processing unit 6 of the first detector 10 compares the computed values PGS[2, 3] (sum of the corrected values, corrected maximum values or else a corrected and averaged value) by the second detector 20 and the values PGS[1, 2] computed by the first detector 10.

For this purpose, during a first sub-step, the processing unit 6 of the first detector 10 multiplies the value PGS[2, 3] computed on the basis of the signals generated by the second and third sensors 5 by a predefined safety coefficient Ks:Ks*PGS[2, 3]. The safety coefficient Ks is greater than or equal to 1, for example equal to 1.5 or 2.

In parallel, during a second sub-step, the processing unit 6 of the second detector 10 multiplies the value PGS[1, 2] computed on the basis of the signals generated by the first and second sensors 5 by the predefined safety coefficient Ks:Ks*PGS[1, 2].

During a third sub-step, the first detector 10 compares the value PGS[1, 2] with the value Ks*PGS[2, 3] which it has computed on the basis of the signals generated by the first and second sensors 5. If the value PGS[1, 2] computed on the basis of the signals generated by the first and second sensors 5 is less than the value Ks*PGS[2, 3] obtained by multiplying the safety coefficient Ks by the value computed on the basis of the signals generated by the second and third sensors 5 (i.e. if PGS[1, 2]<Ks*PGS[2, 3]), the processing unit 6 of the first detector 10 deletes or does not send any instructions to generate an alarm to the emitters 8 of the first and the second detector 10, 20.

In parallel, during a fourth sub-step, the second detector 20 compares the value PGS[2, 3] with the value Ks*PGS[1, 2] obtained by multiplying Ks by the value of the signals generated by the first and second sensors 5. If the value PGS[2, 3] computed on the basis of the signals generated by the second and third sensors 5 is less than the value Ks*PGS[1, 2] obtained by multiplying the safety coefficient Ks by the value computed on the basis of the signals generated by the first and second sensors 5 (i.e. if PGS[2, 3]<Ks*PGS[1, 2]), the processing unit 6 of the second detector 20 deletes or does not send any instructions to generate an alarm to the emitters 8 of the second and the third detector 20, 30. In the contrary case, if PGS[2, 3]>Ks*PGS[1, 2], the second detector 2 sends instructions to transmit an alarm to the emitters 8 of the second detector 20 and the third detector 30.

An operator can then easily identify which gate (here, the second) has detected a target object.

It should be noted that the application of a safety coefficient Ks during the comparison of the values computed by the detectors on either side of a given gate confers a margin in the detection of the target objects and reduces the risks of false alarms.

Thus, the sending to the master detector of a gate, by the slave detector of this gate, of the computed value (sum of the corrected values, corrected maximum values or else a corrected and averaged value) for the adjacent gate, for which this same detector is master, makes it possible to determine the location of the target object which has been detected. It will specifically be recalled that the detection by the magnetic sensors 5 is scalar and that a detector sharing two adjacent gates (here the second detector 20) is not capable of determining on what side the target object that it has detected is located.

The detection method S of the invention can be generalized to cover any detection system 1 comprising m detectors, where m is greater than or equal to 4 in such a way as to form m−1 gates and where two adjacent gates have one and the same detector in common.

Figure 7:
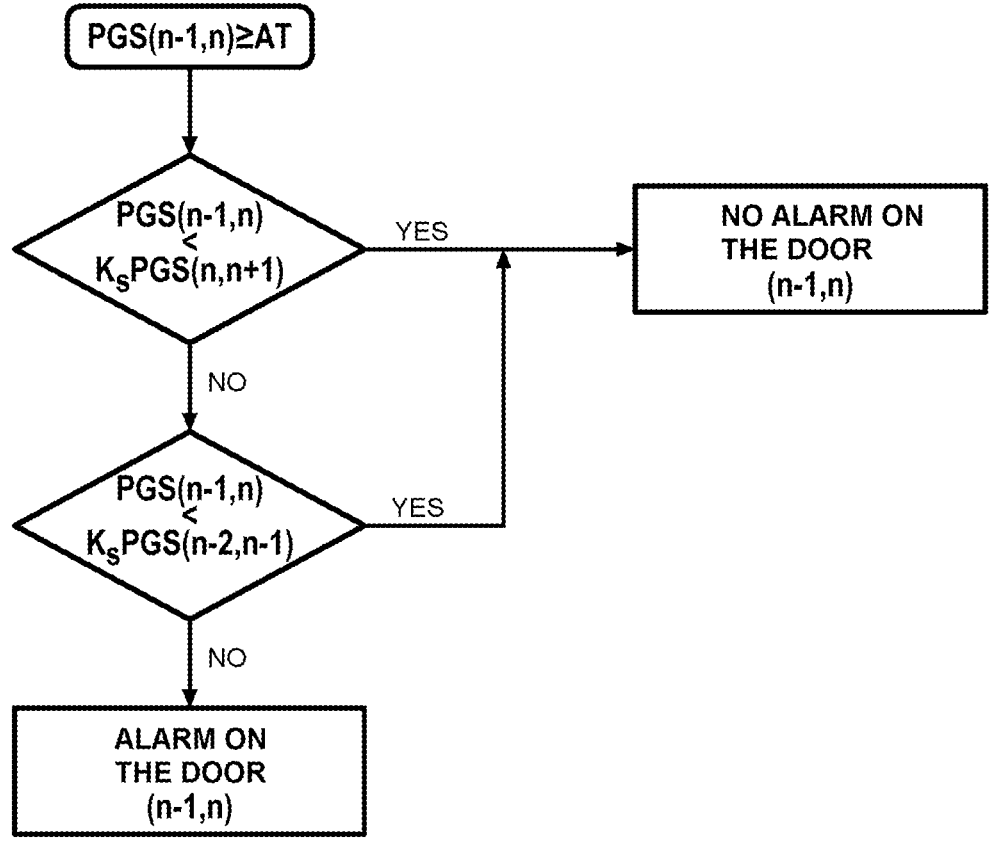
FIG. 7 is a block diagram illustrating the steps of an example of a detection method in accordance with the invention in the case where the detection system comprises at least four detectors (n−2, n−1, n and n+1).

The detection method S then comprises the same steps as those described previously concerning a detection system 1 with three detectors. However, in this case, when a detector n−1 has computed a value PGS[n−1; n] greater than the predetermined threshold value AT, the detection method S comprises, in addition to the steps of comparing this value PGS[n−1; n] and that computed by the detector n−2 (PGS[n−2; n−1]), a step of comparing this value PGS[n−1; n] with that computed by the detector n (PGS[n; n+1]) in order to determine the gate within which a target object has been detected (see FIG. 7). Where applicable, the safety coefficient Ks (Ks≥1) is applied to the value PGS[n; n+1] during the comparison step.

For example, the detector n−1 computes a given value PGS[n−1; n], typically a corrected average value, on the basis of the signals generated by the magnetic sensors 5 of the detectors n and n−1. The detector n−1 (as the slave detector) then sends this computed value PGS[n−1; n] to the detector n−2 (as the master detector) as well as the values of the signals generated by its magnetic sensors 5. The detector n−2 then computes a value PGS[n−2; n−1], here a corrected average value, on the basis of the values of the signals generated by the magnetic sensors 5 of the detectors n−2 and n−1. In the same way, the detector n (as the slave detector of the detector n−1) computes and sends the computed value PGS[n; n+1] to the detector n−1 as well as the values of the signals generated by its magnetic sensors 5. If the value computed by the detector n−2 (as the master detector) is greater than the predetermined threshold value:

the detector n−2:
multiplies the value PGS[n−1; n] computed and transmitted by the detector n−1 by the safety coefficient Ks and
compares the value that it has computed PGS[n−2; n−1] with the value that it has multiplied Ks*PGS[n−1; n]. If the value PGS[n−2; n−1] that it has computed is less than the value computed by the detector n−1 and multiplied by the coefficient Ks (i.e. if PGS[n−2; n−1]<Ks*PGS[n−1; n]), the detector n−2 deduces therefrom that no alarm must be generated by the gate formed by the detectors n−2 and n−1. The detector n−2 therefore does not send any instructions to generate an alarm to the emitters 8 of the detectors n−2 and n−1 (or, where applicable, cancels the instructions to emit an alarm).

the detector n−1, in parallel:
multiplies the value PGS[n−2; n−1] computed and transmitted by the detector n−2 by the safety coefficient Ks and
compares the value that it has computed PGS[n−1; n] with the value that it has multiplied Ks*PGS[n−2; n−1].
If the value PGS[n−1; n] that it has computed is less than the value computed by the detector n−2 and multiplied by the coefficient Ks (i.e. if PGS[n−1; n]<Ks*PGS[n−2; n−1]), the detector n−1 deduces therefrom that no alarm must be generated by the gate formed by the detectors n−1 and n. The detector n−1 therefore does not send any instructions to generate an alarm to the emitters 8 of the detectors n−1 and n (or, where applicable, cancels the instructions to emit an alarm).
multiplies the value PGS[n; n+1] computed and transmitted by the detector n by the safety coefficient Ks and
compares the value it has computed PGS[n−1; n] with the value that it has multiplied Ks*PGS[n; n+1].
If the value PGS[n−1; n] that it has computed is less than the value computed by the detector n and multiplied by the coefficient Ks (i.e. if PGS[n−1; n]<Ks*PGS[n; n+1]), the detector n−1 deduces therefrom that no alarm must be generated by the gate formed by the detectors n−1 and n. The detector n−1 therefore does not send any instructions to generate an alarm to the emitters 8 of the detectors n−1 and n (or, where applicable, cancels the instructions to emit an alarm).

the detector n, in parallel:
multiplies the value PGS[n−1; n] computed and transmitted by the detector n−1 by the safety coefficient Ks and
compares the value that it has computed PGS[n; n+1] with the value that it has multiplied Ks*PGS[n−1; n].
If the value PGS[n; n+1] that it has computed is less than the value computed by the detector n−1 and multiplied by the coefficient Ks (i.e. if PGS[n; n+1]<Ks*PGS[n−1; n]), the detector n deduces therefrom that no alarm must be generated by the gate formed by the detectors n and n+1. The detector n therefore does not send any instructions to generate an alarm to the emitters 8 of the detectors n and n+1 (or, where applicable, cancels the instructions to emit an alarm).

It should be noted that, when the adjacent gates do not share one and the same detector and are each formed by two separate detectors, the detection is done within each gate by the pairs of detectors. Thus the detectors of a given gate do not necessarily communicate with the detectors of an adjacent gate. This is because each gate can operate independently, since it is not necessary to determine the gate through which the target object has passed.

The invention claimed is:

1. A detection system comprising:
a first detector comprising a first post, a first base, and a first magnetic sensor configured to generate a first signal, wherein the first signal is representative of an intensity of a detected magnetic field;
a second detector comprising a second post, a second base, and a second magnetic sensor configured to generate a second signal, wherein the second signal is representative of an intensity of the detected magnetic field and wherein the first detector and the second detector together form a first gate;
a processing unit; and
at least one communication interface configured to transmit the first signal and the second signal to the processing unit,
wherein the processing unit is configured to:
receive the first signal and the second signal;
determine a computed value by:
applying an attenuation coefficient to the received first signal and to the received second signal to obtain a first corrected value and a second corrected value, respectively, the first corrected value being based on a first distance between the first magnetic sensor and a target object and the second corrected value being based on a second distance between the second magnetic sensor and the target object, and calculating the computed value based on the first corrected value and the second corrected value; or
calculating a calculated value based on the received first signal and the received second signal, and applying the attenuation coefficient to the calculated value to obtain the computed value; and
send instructions to generate an alarm in response to determining that the computed value is greater than a predetermined threshold value.

2. The detection system of claim 1, wherein the communication interface is a wireless communication interface.

3. The detection system of claim 1, wherein the first detector and the second detector are portable.

4. The detection system of claim 1, further comprising a third detector comprising a third magnetic sensor configured to generate a third signal, wherein the third signal is representative of an intensity of the magnetic field, wherein:
the second detector and the third detector together form a second gate.

5. The detection system of claim 4, wherein:
the processing unit is housed in the first detector;
the detection system further comprises an additional processing unit housed in the second detector; and
the additional processing unit is configured to:
determine an additional computed value by:
applying the attenuation coefficient or an additional attenuation coefficient to the third signal to obtain a third corrected value, and computing the additional computed value based on the second corrected value and the third corrected value; or
calculating an additional calculated value based on the second signal and the third signal, and applying the attenuation coefficient or the additional attenuation coefficient to the additional calculated value to obtain the additional computed value; and
transmit to the processing unit via the communication interface the additional computed value.

6. A detection method comprising:
generating a first signal with a first magnetic sensor of a first detector comprising a first post and a first base, and a second signal with a second magnetic sensor of a second detector comprising a second post and a second base, wherein the first signal and the second signal are each representative of an intensity of a magnetic field and wherein the first detector and the second detector together form a first gate;
determining, via a processing unit that receives the first and the second signals, a computed value by:
applying an attenuation coefficient to the first signal and to the second signal to obtain a first corrected value and a second corrected value, respectively, the first corrected value being based on a first distance between the first magnetic sensor and a target object and the second corrected value being based on a second distance between the second magnetic sensor and the target object, and calculating the computed value based on the first corrected value and the second corrected value; or
calculating a calculated value based on the first signal and the second signal, and applying the attenuation coefficient to the calculated value to obtain the computed value;
comparing, via the processing unit, the computed value with a predetermined threshold value; and
sending instructions to generate an alarm in response to determining that the computed value is greater than the predetermined threshold value.

7. The detection method of claim 6, further comprising:
generating a first additional signal with a first additional magnetic sensor of the first detector and a second additional signal with a second additional magnetic sensor of the second detector; and
determining an additional computed value by:
applying the attenuation coefficient or an additional attenuation coefficient to the first additional signal and the second additional signal to obtain a first additional corrected value and a second additional corrected value, respectively, and computing the additional computed value based on the first additional corrected value and the second additional corrected value; or
calculating an additional calculated value based on the first additional signal and the second additional signal, and applying the attenuation coefficient or the additional attenuation coefficient to the additional calculated value to obtain the additional computed value; and comparing the additional computed value with the predetermined threshold value; and
sending instructions to generate an alarm in response to determining that the additional computed value is greater than the predetermined threshold value.

8. The detection method of claim 6, wherein:
calculating the computed value based on the first corrected value and the second corrected value comprises computing an average value based on the first corrected value and the second corrected value; and
calculating the calculated value based on the first signal and the second signal comprises computing an average value based on the first signal and the second signal.

9. The detection method of claim 6, wherein applying the attenuation coefficient further comprises:

determining a maximum value of the first signal and the second signal at a given time;
determining a minimum value of the first signal and the second signal at a given time;
calculating a ratio of the maximum value to the minimum value;
comparing the ratio with a first threshold and with a second threshold, the second threshold being higher than the first threshold; and
deducing the attenuation coefficient, wherein the attenuation coefficient is equal to a first value when the ratio is less than the first threshold, to a second value different from the first value when the ratio is greater than the second threshold, and to a value between the first value and the second value when the ratio is between the first threshold and the second threshold.

10. The detection method of claim 9, wherein the attenuation coefficient is a linear function that depends on the ratio when the ratio is between the first threshold and the second threshold.

11. The detection method of claim 9, wherein the first value is equal to 1, the second value is equal to 0.1, and the attenuation coefficient is defined by the following function when the ratio is between the first threshold and the second threshold:
where R is the value of the ratio.

12. The detection method of claim 6, wherein the first detector comprises at least two first magnetic sensors and the second detector comprises at least two second magnetic sensors, each first magnetic sensor being associated with a corresponding second magnetic sensor so as to form a pair.

13. The detection method of claim 6, wherein the detection system further comprises a third detector comprising a third magnetic sensor configured to generate a third signal, wherein the third signal is representative of an intensity of the magnetic field, wherein the detection method further comprises:
applying the attenuation coefficient or a different attenuation coefficient to the third signal to obtain a third corrected value; and
computing an additional computed value based on the second corrected value and the third corrected value.

14. The detection method of claim 13, further comprising deducing which gate detected the magnetic field between the first gate and a second gate formed by the second detector and the third detector based on the computed value and the additional computed value.

15. The detection method of claim 14, wherein deducing which gate detected the magnetic field further comprises:
multiplying the additional computed value by a safety coefficient;
comparing the computed value with the additional computed value multiplied by the safety coefficient;
multiplying the computed value by the safety coefficient; and
comparing the additional computed value with the computed value multiplied by the safety coefficient.

16. The detection method of claim 15, further comprising:
sending instructions to generate an alarm in response to the computed value being greater than the additional computed value multiplied by the safety coefficient; or
sending instructions to generate an alarm in response to the additional computed value being greater than the computed value multiplied by the safety coefficient.

17. The detection method of claim 14, wherein:
the first detector and the second detector each comprise a processing unit;
computing the computed value is performed by the processing unit of the first detector;
computing the additional computed value is performed by the processing unit of the second detector; and
deducing which gate detected the magnetic field is performed by the processing unit of the second detector and by the processing unit of the first detector.

18. The detection method of claim 15 further comprising:
generating a fourth signal with a fourth magnetic sensor of a fourth detector, wherein the fourth signal is representative of an intensity of the magnetic field;
applying the attenuation coefficient or a different attenuation coefficient to the fourth signal to obtain a fourth corrected value;
computing a supplementary computed value based on the third corrected value and the fourth corrected value;
multiplying the supplementary computed value by the safety coefficient;
comparing the additional computed value with the supplementary computed value multiplied by the safety coefficient;
comparing the supplementary computed value with the additional computed value multiplied by the safety coefficient; and
deducing which gate detected the magnetic field between the first gate, the second gate, and a third gate formed by the third detector and the fourth detector.

19. The detection method of claim 18, further comprising:
sending instructions to generate an alarm in response to the additional computed value being greater than the supplementary computed value multiplied by the safety coefficient; or
sending instructions to generate an alarm in response to the supplementary computed value being greater than the additional computed value multiplied by the safety coefficient.

20. The detection method of claim 6, wherein the first detector and the second detector are portable.

21. The detection method of claim 7, wherein:
calculating the computed value comprises computing an average value based on the first corrected value and the second corrected value, and computing the additional computed value comprises computing an additional average value based on the first additional corrected value and the second additional corrected value; or
calculating the calculated value comprises computing an average value based on the first value and the second value, and computing the additional computed value comprises computing an additional average value based on the first additional corrected value and the second additional corrected value.

22. A detection system comprising:
a first detector comprising a first post, a first base, and a first set of magnetic sensors positioned along the first post and configured to generate a first signal, wherein the first signal is representative of an intensity of a detected magnetic field;
a second detector comprising a second post, a second base, and a second set of magnetic sensors positioned along the second post and configured to generate a second signal, wherein the second signal is representative of an intensity of the detected magnetic field;
a processing unit; and
at least one communication interface configured to transmit the first signal and the second signal to the processing unit,
wherein the processing unit is configured to:

receive the first signal and the second signal;
determine a computed value by:
- applying an attenuation coefficient to the received first signal and to the received second signal to obtain a first corrected value and a second corrected value, respectively, the first corrected value being based on a first distance between the first set of magnetic sensors and a target object and the second corrected value being based on a second distance between the second magnetic sensor and the target object, and calculating the computed value based on the first corrected value and the second corrected value; or
- calculating a calculated value based on the received first signal and the received second signal, and applying the attenuation coefficient to the calculated value to obtain the computed value; and send instructions to generate an alarm in response to determining that the computed value is greater than a predetermined threshold value.

* * * * *